US011557143B2

(12) United States Patent
Lin et al.

(10) Patent No.: US 11,557,143 B2
(45) Date of Patent: Jan. 17, 2023

(54) DISPLAY PANEL AND DISPLAY DEVICE

(71) Applicant: Xiamen Tianma Micro-Electronics Co., Ltd., Xiamen (CN)

(72) Inventors: Fuyin Lin, Xiamen (CN); Shaoting Lin, Xiamen (CN); Hailiang Wang, Xiamen (CN); Bozhi Liu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 169 days.

(21) Appl. No.: 16/896,783

(22) Filed: Jun. 9, 2020

(65) Prior Publication Data
US 2021/0200979 A1   Jul. 1, 2021

(30) Foreign Application Priority Data

Dec. 31, 2019   (CN) .......................... 201911415562.1

(51) Int. Cl.
*G06K 9/00* (2022.01)
*G06V 40/12* (2022.01)
*H01L 27/32* (2006.01)
*G06V 40/13* (2022.01)
*H01L 27/146* (2006.01)

(52) U.S. Cl.
CPC .......... *G06V 40/12* (2022.01); *G06V 40/1318* (2022.01); *H01L 27/322* (2013.01); *H01L 27/3234* (2013.01); *H01L 27/3276* (2013.01); *H01L 27/14678* (2013.01)

(58) Field of Classification Search
CPC .. G06V 40/12; G06V 40/1318; H01L 27/322; H01L 27/3234; H01L 27/3276; H01L 27/14678; B32B 7/023; G02B 6/42
See application file for complete search history.

(56) References Cited

U.S. PATENT DOCUMENTS

| 2019/0138154 A1* | 5/2019 | Smith | ..................... B32B 7/023 |
| 2020/0042766 A1* | 2/2020 | Yang | ................... G02F 1/13318 |
| 2020/0119108 A1* | 4/2020 | Park | ..................... G06V 40/1318 |
| 2021/0334506 A1* | 10/2021 | Gao | ......................... G02B 6/42 |

FOREIGN PATENT DOCUMENTS

CN          107480584 A    12/2017

* cited by examiner

*Primary Examiner* — Abdul-Samad A Adediran
(74) *Attorney, Agent, or Firm* — Anova Law Group, PLLC

(57) ABSTRACT

A display panel includes an array substrate, a protective cover, a fingerprint identification circuit, and an optical structure. The array substrate and the protective cover are disposed oppositely, where the protective cover is located at a light exiting side of the array substrate. The fingerprint identification circuit is located at a side of the array substrate facing away or toward the protective cover and is configured to receive detection light and perform a fingerprint detection according to the detection light. The optical structure is located at a side of the protective cover facing away from the array substrate and is configured to increase a reflection amount of the detection light received by the fingerprint identification circuit.

19 Claims, 16 Drawing Sheets

DISPLAY PANEL AND DISPLAY DEVICE

CROSS-REFERENCE TO RELATED APPLICATION

This application claims priority to Chinese Patent Application No. 201911415562.1, filed on Dec. 31, 2019, the entire content of which is incorporated herein by reference.

TECHNICAL FIELD

The present disclosure relates to the display technology field and, more particularly, to a display panel and a display device, which can improve fingerprint detection accuracy.

BACKGROUND

A fingerprint identification technology is a technology that classifies and compares the fingerprints of identified objects for identification. The fingerprint identification technology has been applied in various fields as one of biometric identification technologies. Before a user uses a device having a fingerprint identification function, the user only needs to touch a fingerprint identification area of a display device with fingers for authorization verification. The fingerprint identification technology simplifies an authorization verification process.

The existing display panel having the fingerprint identification function, especially, by integrating a fingerprint identification chip in the display panel of a front display area, has low fingerprint identification accuracy. That is, the user uses the fingers that have been recorded for the authorization verification, but the fingerprint identification chip of the display device cannot successfully authenticate the fingerprint accurately at once. The user needs to repeat multiple verifications to successfully pass the authorization verification. The low fingerprint identification accuracy has a negative impact on user experience.

SUMMARY

Embodiments of the present disclosure provide a display panel including an array substrate, a protective cover, a fingerprint identification circuit, and an optical structure. The array substrate and the protective cover are disposed oppositely, where the protective cover is located at a light exiting side of the array substrate. The fingerprint identification circuit is located at a side of the array substrate facing away and toward the protective cover and is configured to receive detection light and perform a fingerprint detection according to the detection light. The optical structure is located at a side of the protective cover facing away from the array substrate and is configured to increase a reflection amount of the detection light received by the fingerprint identification circuit.

Embodiments of the present disclosure provide a display device including a display panel. The display panel includes an array substrate, a protective cover, a fingerprint identification circuit, and an optical structure. The array substrate and the protective cover are disposed oppositely, where the protective cover is located at a light exiting side of the array substrate. The fingerprint identification circuit is located at a side of the array substrate facing away and toward the protective cover and is configured to receive detection light and perform a fingerprint detection according to the detection light. The optical structure is located at a side of the protective cover facing away from the array substrate and is configured to increase a reflection amount of the detection light received by the fingerprint identification circuit.

DETAILED DESCRIPTION OF THE EMBODIMENTS

In embodiments of the present disclosure, technical solutions are described clearly in conjunction with accompanying drawings according to the embodiments of the present disclosure. The described embodiments are merely a part of the embodiments of the present disclosure, but not all the embodiments. Based on the embodiments of the present disclosure, all other embodiments obtained by those of ordinary skill in the art without creative efforts are within the scope of the present disclosure.

Figure 1:
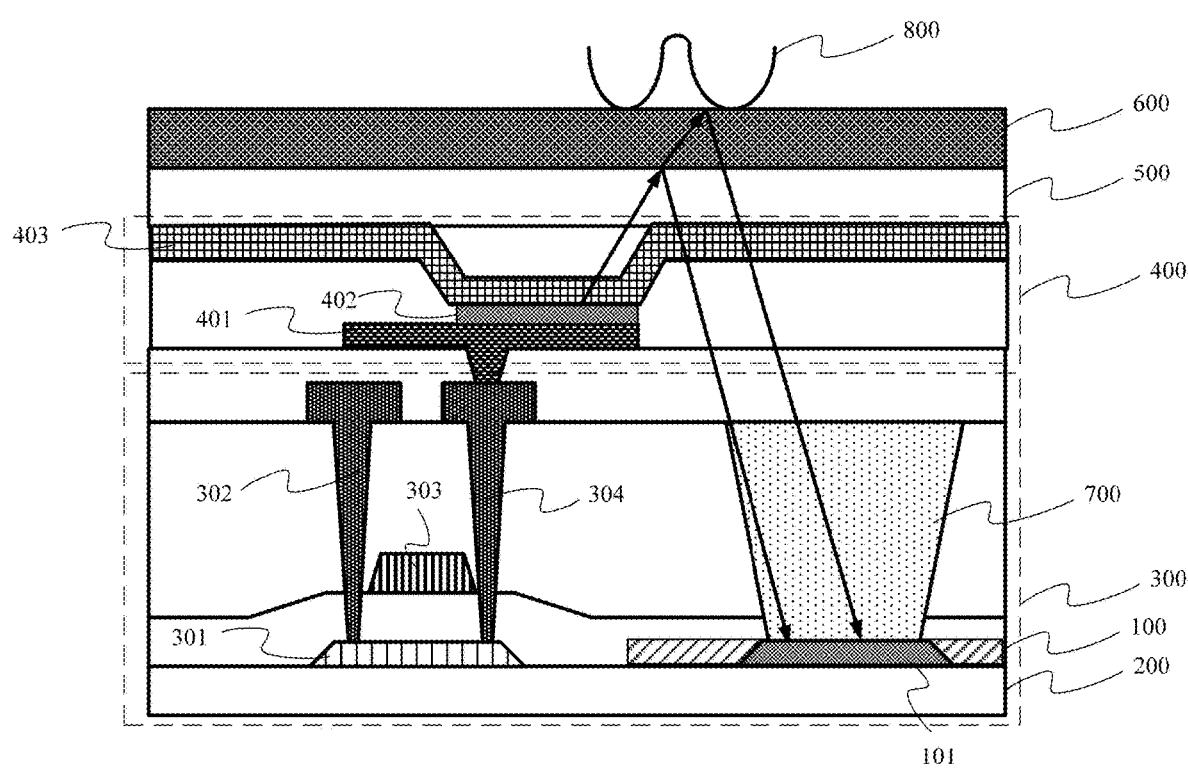
FIG. 1 illustrates a schematic partial cross-section structural diagram of an exemplary display panel according to some embodiments of the present disclosure.
Figure 2:
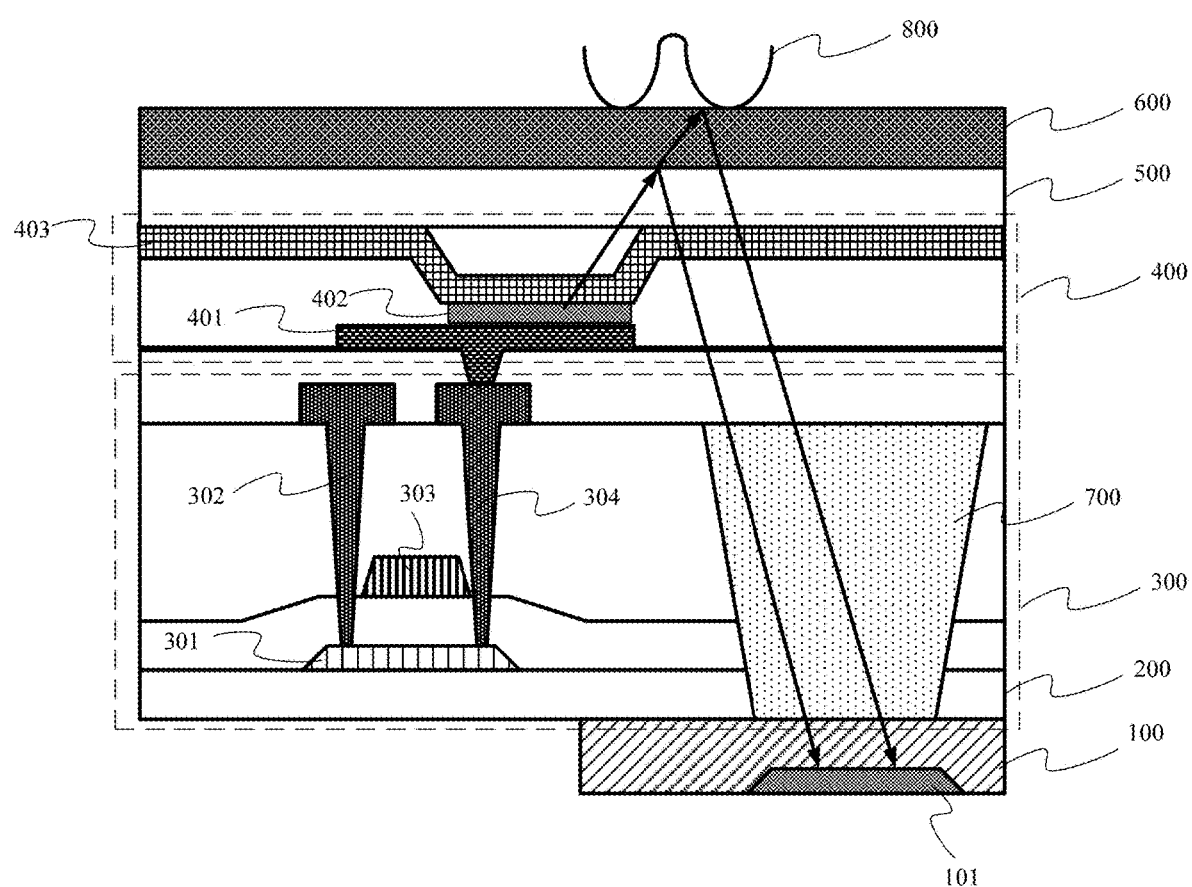
FIG. 2 illustrates a schematic partial cross-section structural diagram of an exemplary display panel according to some embodiments of the present disclosure.

Embodiments of the present disclosure provide a display panel. FIG. 1 and FIG. 2 illustrate schematic cross-section diagrams of the display panel, which includes an array substrate 200, a protective cover 500, a fingerprint identification circuit 100, and an optical structure 600. The array substrate 200 and the protective cover 500 are disposed oppositely. The protective cover 500 is located at a light exiting side of the array substrate 200. The fingerprint identification circuit 100 is located at a side of the array substrate 200 facing away and toward the protective cover 500, and is configured to perform fingerprint detection according to received detection light. The optical structure 600 is located at a side of the protective cover 500 facing away from the array substrate 200, and is configured to increase a reflection amount of the detection light received by the fingerprint identification circuit 100.

In a structure shown in FIG. 1, the fingerprint identification circuit 100 is arranged at a side of the array substrate 200 facing toward the protective cover 500. In a structure shown in FIG. 2, the fingerprint identification circuit 100 is arranged at a side of the array substrate 200 facing away from the protective cover 500. In some embodiments, the fingerprint identification circuit 100 includes a plurality of photosensitive elements 101 arranged in an array. The photosensitive elements 101 are usually prepared by coating or other film growth processes.

For a clear demonstration, FIG. 1 and FIG. 2 show only the photosensitive structure 101 of the fingerprint identification circuit 100 but do not show other structures of the fingerprint identification circuit 100. The photosensitive structure 101 in FIG. 1 is arranged at the array substrate 200. The photosensitive structure 101 is formed through the same film growth process with other film structures of a thin-film-transistor, etc., on the array substrate 200.

FIG. 1 and FIG. 2 also show a driver circuit layer 300 and a pixel structure layer 400. The driver circuit layer 300 is configured with the thin-film-transistor. The thin-film-transistor includes an active layer 301, a gate electrode 303, a source electrode 302, and a drain electrode 304. The drain electrode 304 is connected to a positive electrode 401 of display pixels of the pixel structure layer 400. The positive electrode 401 of the display pixels is connected to a light exiting layer 402 of the display pixels. The light exiting layer 402 faces away from the positive electrode 401 of the display pixels and is connected to a negative electrode 403 of the display pixels. Insulation layer structures such as a gate insulating layer, a flat layer, a passivation layer, etc., are also included between the layers of the thin-film-transistor. The insulation layer structures such as a pixel defining layer, etc., are also included at the pixel structure layer 400. For the clear demonstration, these insulation layer structures are not shown in FIG. 1 and FIG. 2.

To reduce absorption of the detection light by each of the film layers of the driver circuit layer 300, an opening structure is usually configured at the driver circuit layer 300, and a transparent film layer 700 is filled at the opening structure. An orthogonal projection of the transparent film layer 700 and an orthogonal projection of the photosensitive structure 101 at the array substrate 200 at least partially overlap with each other.

In FIG. 1 and FIG. 2, all the insulation layers of the driver circuit layer 300 need to be excavated to form the opening structure, such that the film layers with low light transmittance do not absorb the detection light. In addition, in FIG. 2, beside excavating all the insulation layers of the driver circuit layer 300, a part of structures above the photosensitive structure 101 of the array substrate 200 also needs to be excavated to form the opening structure, such that the array substrate 200 does not absorb the detection light.

In FIG. 1 and FIG. 2, the detection light received by the photosensitive structure 101 of the fingerprint identification circuit 100 is sent by the display pixels. The photosensitive structure 101 absorbs the detection light after the detection light is reflected by an operation object 800 (e.g., fingers) or the optical structure 600. The photosensitive structure 101 processes the detection light, and the fingerprint identification circuit 100 finally obtains fingerprint information of the operation object.

In some embodiments, a number of the fingerprint identification circuits 100 may be multiple. Correspondingly, the display pixels that provide the detection light for each fingerprint identification circuit 100 have the same number as the fingerprint identification circuits 100. That is, each the display pixel corresponds to a fingerprint identification circuit 100. Each display pixel provides the detection light for the corresponding fingerprint identification circuit 100 to ensure that the fingerprint identification circuit 100 can normally perform fingerprint identification. FIG. 1 and FIG. 2 use only one display pixel and one fingerprint identification circuit 100 as an example for description.

In addition, the display pixels shown in FIG. 1 and FIG. 2 are described by taking a feasible organic light-exiting display (OLED) pixel as an example. In some embodiments, the display pixels may also be liquid crystal display pixels. The structures of the driver circuit layer 300 and the pixel structure layer 400 provided by the embodiments of the present disclosure shown in FIG. 1 and FIG. 2 are merely used as examples for description. When a display panel type and an application scenario change, the driver circuit layer 300 and the pixel structure layer 400 are modified correspondingly to adapt to different display panels or different application scenarios.

Figure 3:
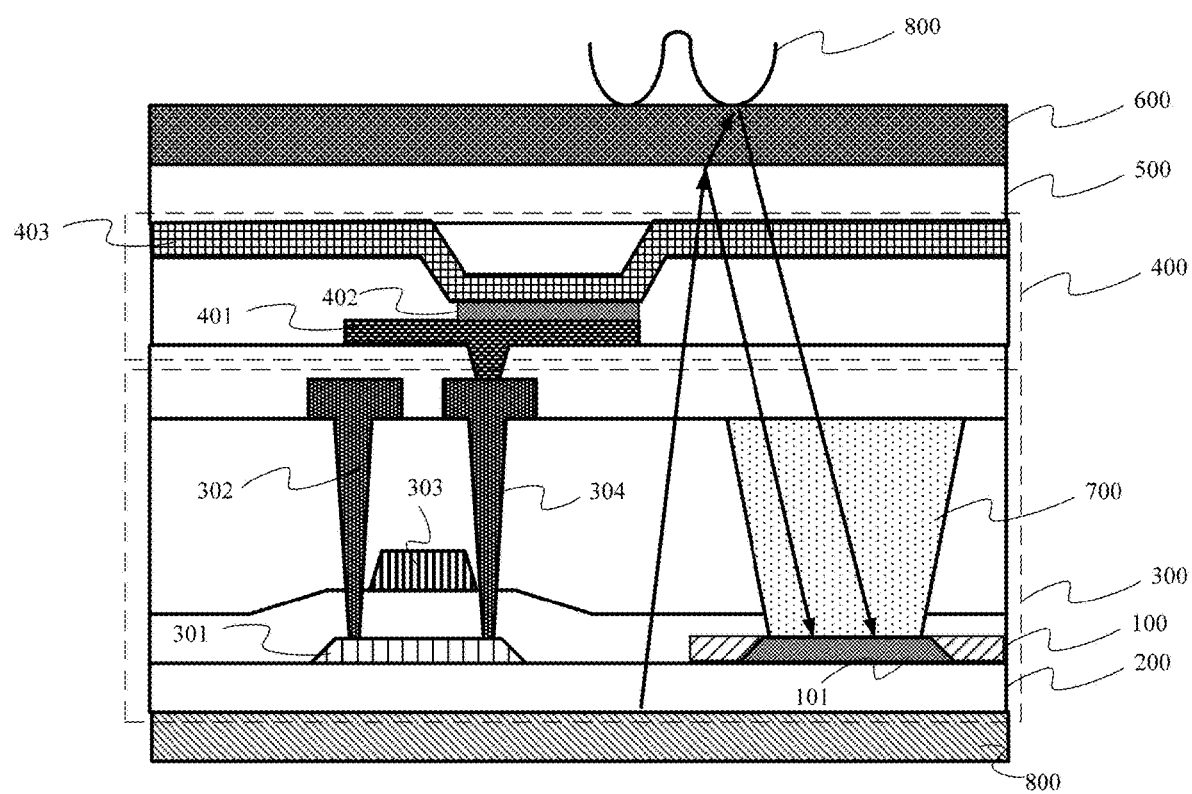
FIG. 3 illustrates a schematic partial cross-section structural diagram of an exemplary display panel according to some embodiments of the present disclosure.

FIG. 3 illustrates a schematic cross-section diagram of another exemplary display panel according to some embodiments of the present disclosure. Besides reusing light provided by the display pixels as the detection light of the fingerprint identification circuit 100, in FIG. 3, the detection light received by the photosensitive structure 101 of the fingerprint identification circuit 100 may be exited by an additionally provided fingerprint light exiting structure 800. The fingerprint light exiting structure 800 is additionally provided. By considering a display effect of the light exited by the fingerprint light exiting structure 800 on the display panel, the fingerprint light exiting structure 800 may not exit the detection light when the display panel displays normally. The fingerprint light exiting structure 800 may exit the detection light only during a fingerprint identification phase. In addition, during the fingerprint identification phase, the display pixels can also be controlled not to exit light. An interference of the light exited by the display pixels to the fingerprint identification is avoided.

Besides an above-mentioned method of an interference of the detection light to the normal display of the display panel, invisible light may also be used as the detection light. For example, the invisible light may be infrared light, microwave, etc. Since ultraviolet light is harmful to human body when a dose exceeds a standard, the ultraviolet light is generally not used as the detection light.

Figure 4:
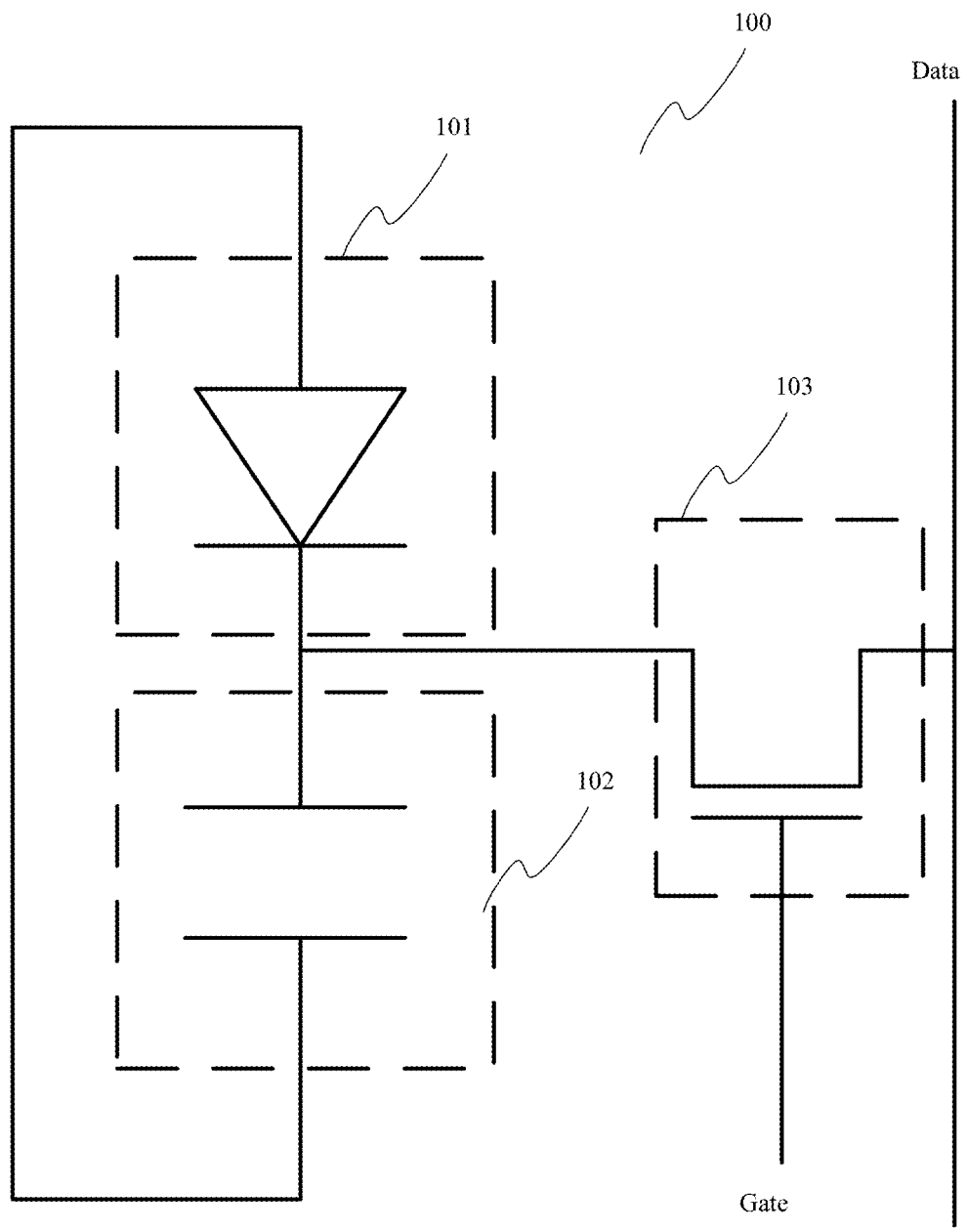
FIG. 4 illustrates a schematic structural diagram of a fingerprint identification circuit according to some embodiments of the present disclosure.
Figure 5:
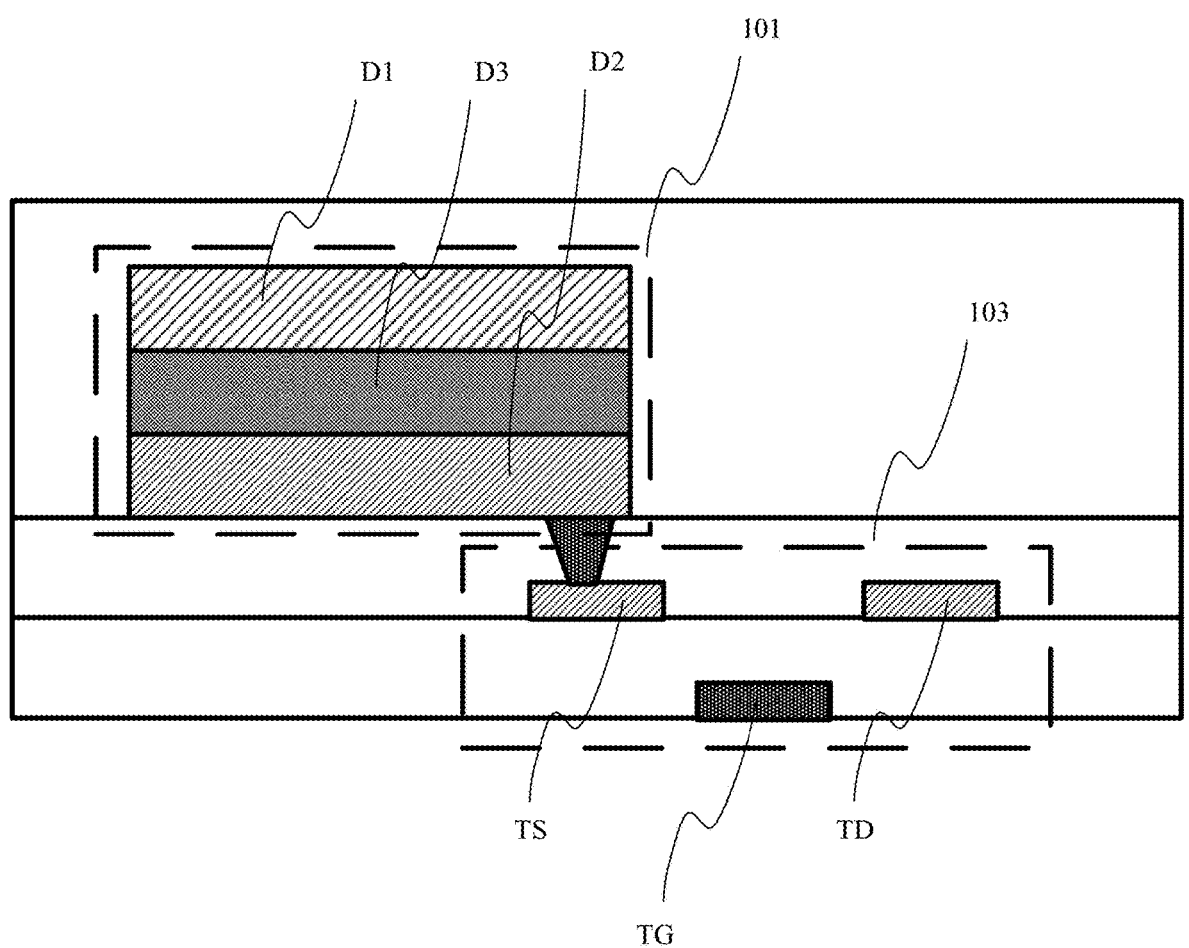
FIG. 5 illustrates a schematic diagram of a photosensitive structure and a driver transistor cross-section structure of a fingerprint identification circuit according to some embodiments of the present disclosure.

For a specific structure of the fingerprint identification circuit 100, FIG. 4 shows a schematic diagram of a feasible circuit configuration of the fingerprint identification circuit 100. FIG. 5 shows a schematic cross-section diagram of the photosensitive structure 101 of the fingerprint identification circuit 100 and a driver transistor.

In FIG. 4, the fingerprint identification circuit 100 includes a photosensitive structure 101, a storage capacitor 102, and a driver transistor 103. In some embodiments, the photosensitive structure 101 shown in FIG. 4 is a photodiode. A positive electrode D1 of the photodiode is electrically connected to a first electrode of the storage capacitor 102. A negative electrode D2 of the photodiode is electrically connected to a second electrode of the storage capacitor 102 and a source electrode TS of the driver transistor 103. A gate electrode TG of the driver transistor 103 is electrically connected to a switch control line Gate. A drain electrode TD of the driver transistor 103 is electrically connected to a signal detection line Data. The photodiode is configured to convert the detection light reflected by the operation object into an electric signal. During the fingerprint identification phase, the driver transistor 103 is turned on, and the electric signal is transmitted to the signal detection line Data through the driver transistor 103 to perform the fingerprint identification according to the electric signal.

With reference to FIG. 5, the photodiode also includes a PIN diode D3 located between the positive electrode D1 and the negative electrode D2. The negative electrode D2 is formed by an opaque metal. A boundary of the PIN diode D3 does not exceed a boundary of the negative electrode D2. The positive electrode D1 of the photodiode is located at a side of the PIN diode D3 facing away from the negative electrode D2. The PIN diode D3 has a photosensitivity and a unidirectional conductivity. When no light is received, the PIN diode D3 has a small saturation reverse leakage current, that is, a dark current, and at this time, the photodiode is turned off. When the detection light is received, the saturation reverse leakage current of the PIN diode D3 increases greatly to form an electric signal, and the electric signal changes with an intensity change of incident light. In the embodiments, the optical structure 600 can increase the reflection amount. When the detection light received by the fingerprint identification circuit 100 is reflected by the operation object, an amount of signals used by the fingerprint identification circuit 100 for the fingerprint identification is increased. The fingerprint identification circuit 100 can obtain more fingerprint information of the operation object carried by the detection light, such that the fingerprint identification accuracy of the fingerprint identification circuit 100 is improved.

Figure 6:
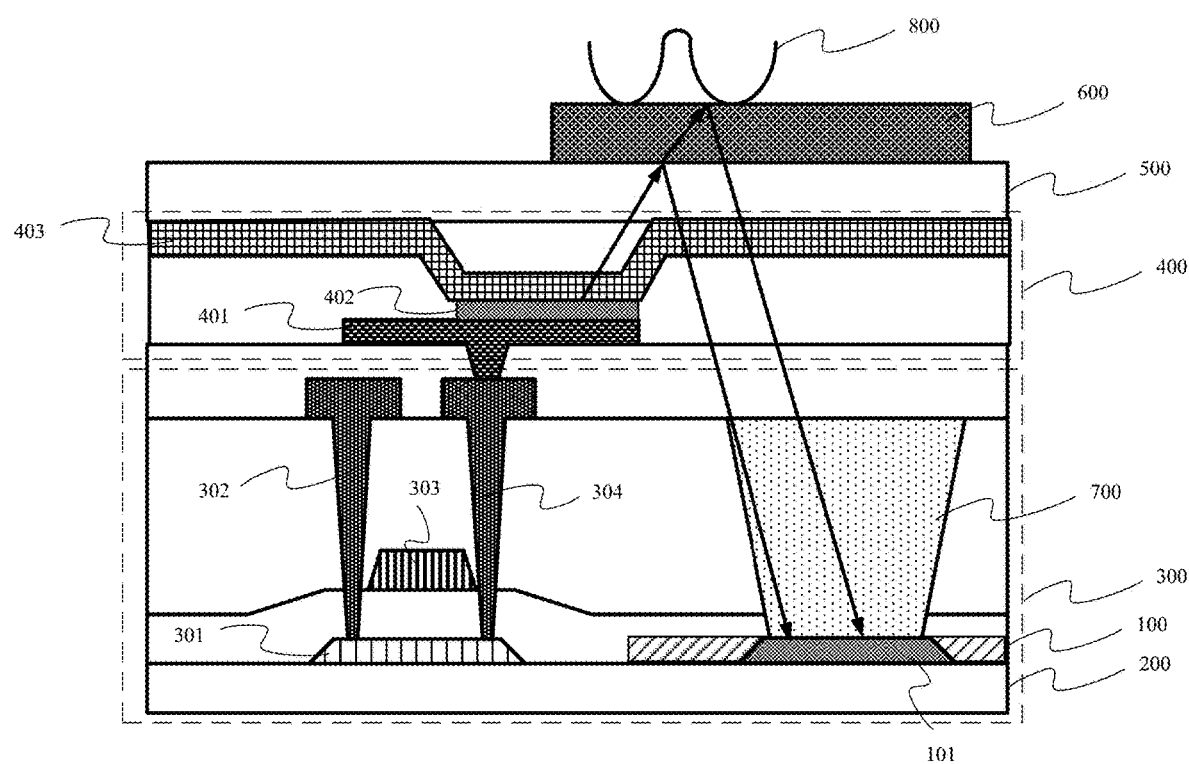
FIG. 6 illustrates a schematic partial cross-section structural diagram of an exemplary display panel according to some embodiments of the present disclosure.

For a setting area of the optical structure 600, reference is made to FIG. 1, FIG. 2, FIG. 3, and FIG. 6. FIG. 6 illustrates a schematic cross-section structural diagram of an exemplary display panel according to some embodiments of the present disclosure. In FIG. 1, FIG. 2, and FIG. 3, the optical structure 600 fully covers the protective cover 500. In FIG. 6, the optical structure 600 may only cover a fingerprint detection area of the display panel, as long as the optical structure 600 can realize a purpose of increasing the reflection amount of the detection light for the fingerprint identification circuit 100. In the embodiments shown in FIG. 6, the orthogonal projection of the optical structure 600 at the array substrate 200 and the orthogonal projection of the photosensitive structure 101 of the fingerprint identification circuit 100 at the array substrate 200 at least partially overlap with each other.

Figure 7:
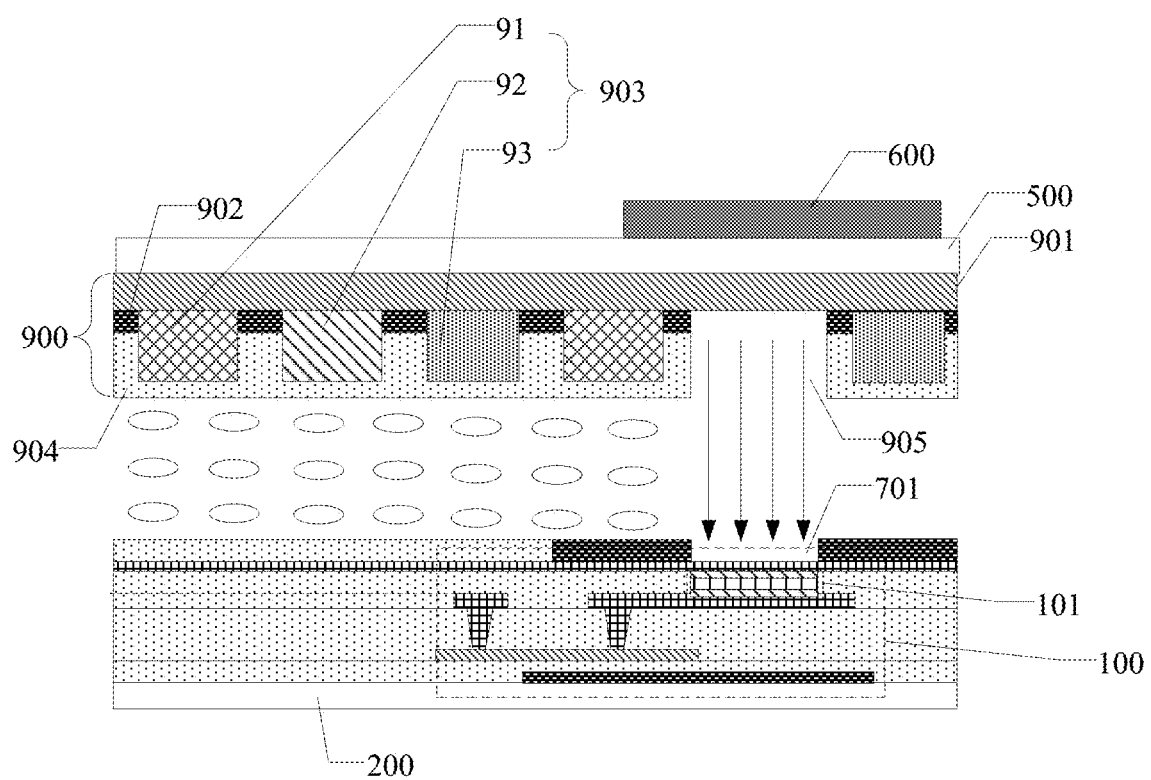
FIG. 7 illustrates a schematic partial cross-section structural diagram of an exemplary display panel according to some embodiments of the present disclosure.

In FIG. 1 to FIG. 6, a specific structure of an OLED display panel is taken as an example for description. When OLED display pixels of the OLED display panel are used to exit color light (e.g., red light, green light, and blue light), a color film substrate does not need to be configured at the display panel. When the display pixels are liquid crystal display pixels, or when the OLED display pixels are used to exit white light, the display panel further includes a color film substrate 900. FIG. 7 illustrates a schematic cross-section structural diagram of an exemplary display panel according to some embodiments of the present disclosure. The color film substrate 900 includes a substrate 901, a black matrix 902 located at a display area of the substrate 901, a color resist 903 located at the black matrix 902, and an ink layer (not shown in FIG. 7) located in a non-display area of the substrate 901.

The color resist 903 includes a first color resist 91, a second color resist 92, and a third color resist 93. FIG. 7 also shows a protective layer 904, a light hole 905, and an opening structure 701. The protective layer 904 protects the color resist 903. The light hole 905 passes through the protective layer 904, the color resist 903, and the black matrix 902. The opening structure 701 exposes the photosensitive unit 101 at a side of the array substrate 200. In FIG. 7, a liquid crystal panel is taken as an example for description.

Figure 8:
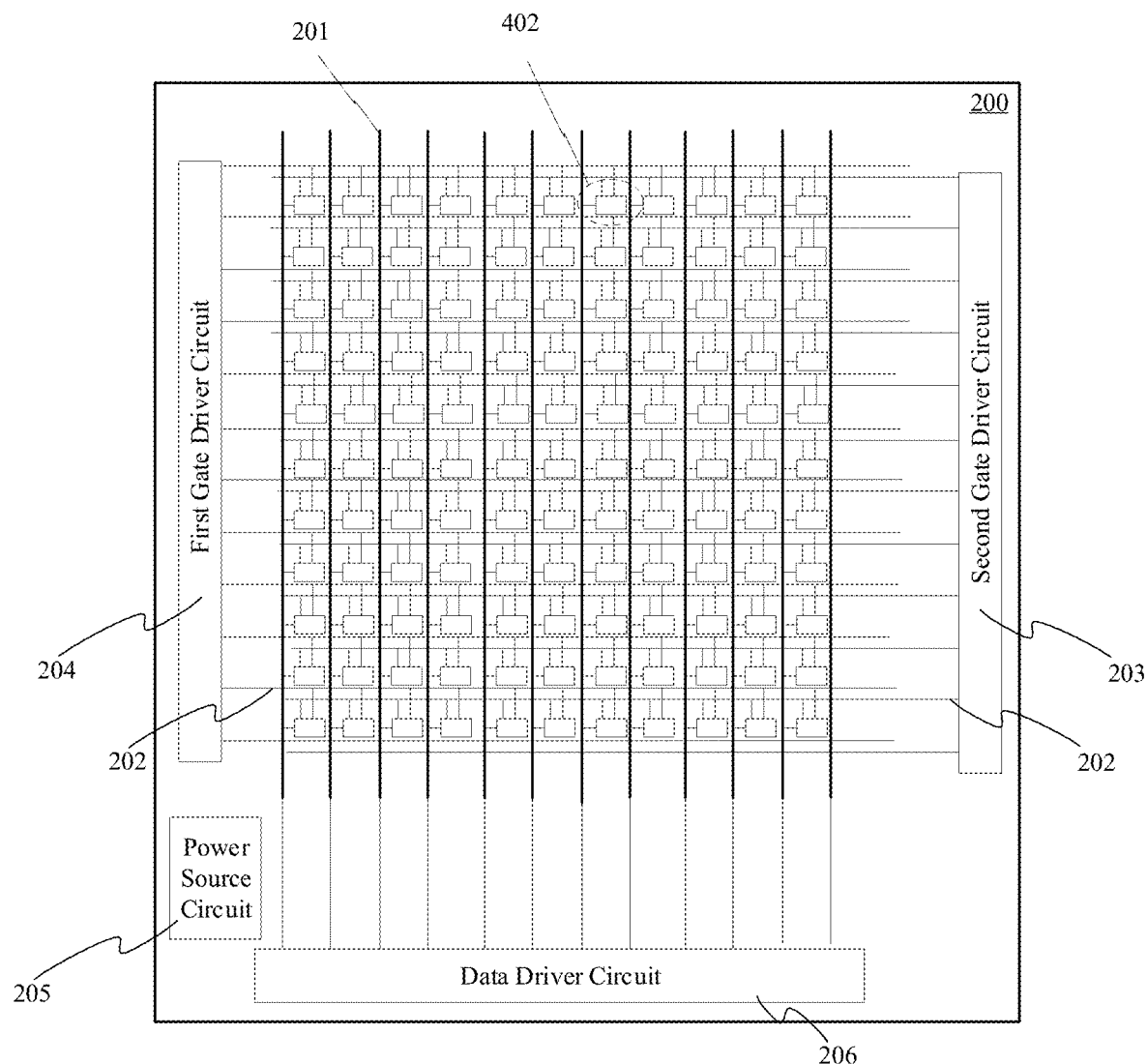
FIG. 8 illustrates a schematic top-down view structural diagram of an exemplary array substrate according to some embodiments of the present disclosure.

After the cross-section structure of the array substrate is generally described, a top-down view structure of the array substrate is simply described as follows. FIG. 8 illustrates a schematic top-down view structural diagram of the exemplary array substrate according to some embodiments of the present disclosure. In the structure shown in FIG. 8, the array substrate further includes gate lines 202, and data lines 201, and display pixels 402. The gate lines 202 and the data lines 201 are arranged across each other to define areas for configuring display pixels 402.

FIG. 8 also shows a gate driver circuit, a data driver circuit 206, and a power source circuit 205. The gate driver circuit includes a first gate driver circuit 204 and a second gate driver circuit 203. That is, in FIG. 8, a gate driving method of the display panel is cross driving. In other embodiments of the present disclosure, the gate driving method may also be a unilateral driving, bilateral driving, etc., which is not limited in the present disclosure.

Based on the above-mentioned embodiments, in an embodiment of the present disclosure, to further improve a reflection effect of the optical structure for the detection light, a refractive index of the optical structure is greater than a refractive index of the protective cover.

Figure 9:
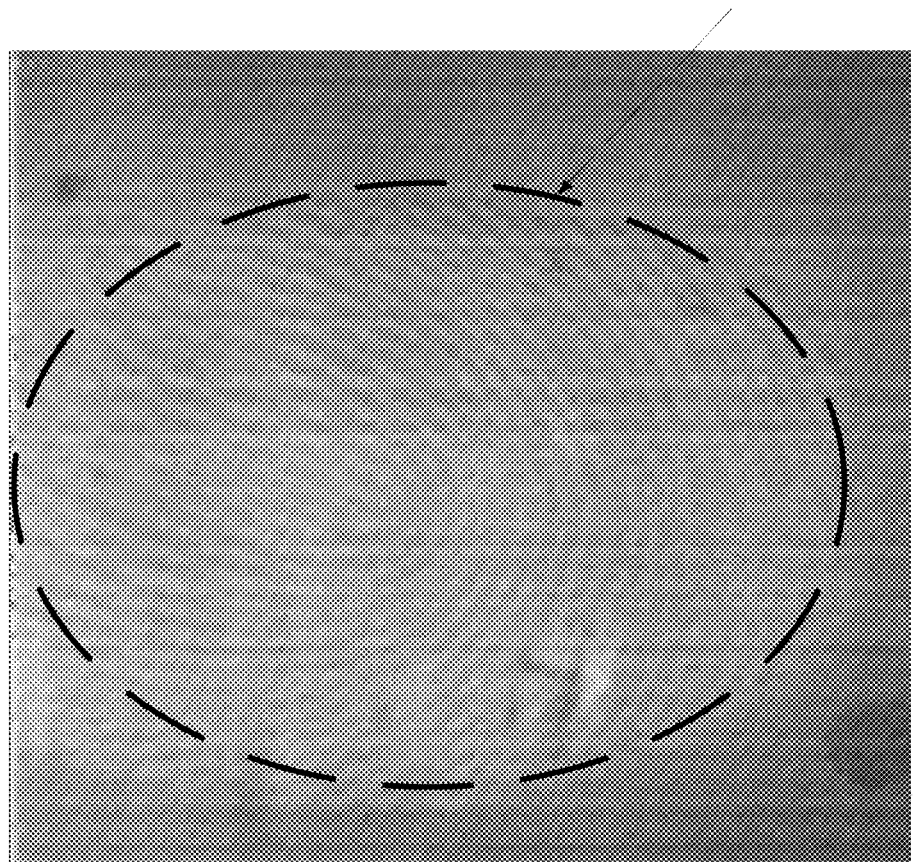
FIG. 9 illustrates a schematic imaging effect picture according to light received by a photosensitive structure of the fingerprint identification circuit, when without an optical structure according to some embodiments of the present disclosure.
Figure 10:
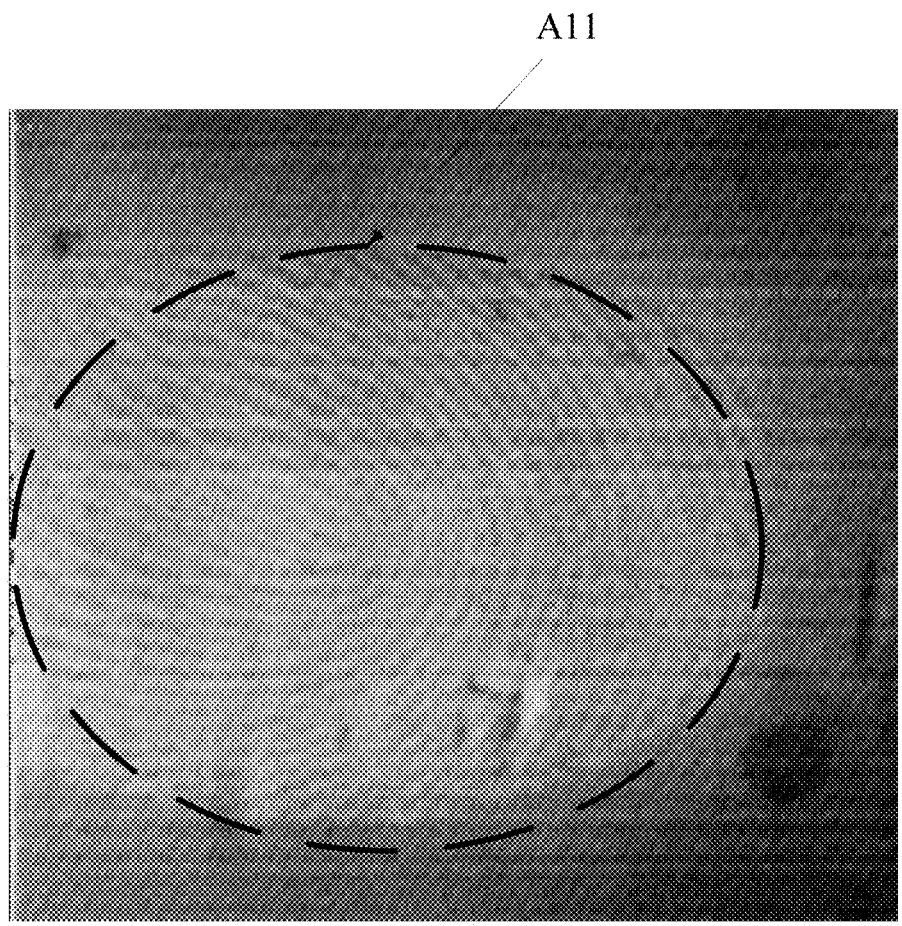
FIG. 10 illustrates a schematic imaging effect picture according to light received by a photosensitive structure of the fingerprint identification circuit, when with an optical structure according to some embodiments of the present disclosure.

FIG. 9 illustrates an imaging effect of light received by a photosensitive structure of the fingerprint identification circuit, when no optical structure is included. A framed area A10 in FIG. 9 is a main area where fingerprints of an imaging effect picture are. FIG. 10 illustrates an imaging effect of light received by a photosensitive structure of the fingerprint identification circuit, when an optical structure is included. A framed area A11 in FIG. 10 is a main area where the fingerprints of the imaging effect picture are. In FIG. 9 and FIG. 10, a refractive index of a protective structure is 1.5. In FIG. 10, the refractive index of the optical structure is 1.76.

By comparing FIG. 9 and FIG. 10, when the refractive index of the optical structure is greater than the refractive index of the protective cover, the optical structure is improved to increase the reflection amount of the detection light. A signal to noise ratio of the finally received electric signal carrying the fingerprint information is increased. The fingerprint identification accuracy of the fingerprint identification circuit is improved.

Figure 11:
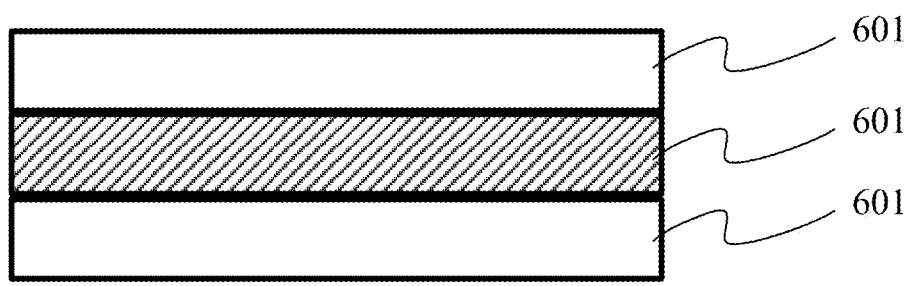
FIG. 11 illustrates a schematic cross-section structural diagram of an exemplary optical structure according to some embodiments of the present disclosure.

In addition, for the specific structure of the optical structure, the optical structure may be a single-layer of a film structure or a multi-layer of a film structure. FIG. 11 illustrates a schematic cross-section diagram of the exemplary optical structure according to some embodiments of the present disclosure. When the optical structure is the multi-layer of the film structure, the optical structure includes a multi-layer of first optical films 601, sequentially stacked one over another, and the adjacent first optical films 601 have different refractive indexes. The equivalent refractive index of the multi-layer of the first optical films 601 is greater than the refractive index of the protective cover.

Figure 12:
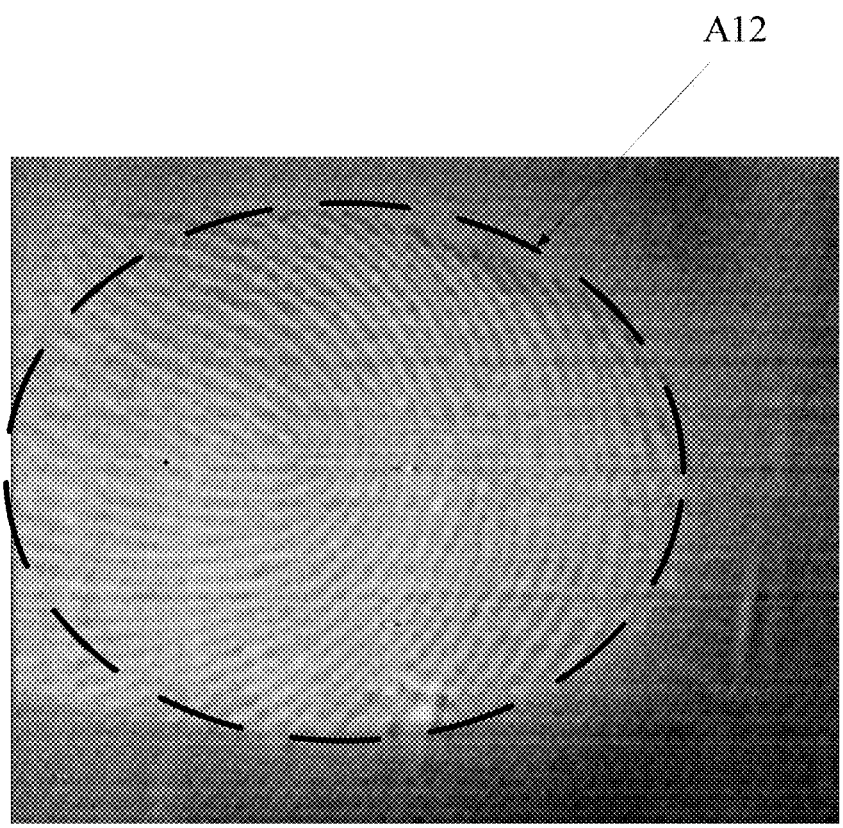
FIG. 12 illustrates a schematic imaging effect picture according to light received by a photosensitive structure of the fingerprint identification circuit, when the optical structure includes multi-layer of first optical films according to some embodiments of the present disclosure.
Figure 13:
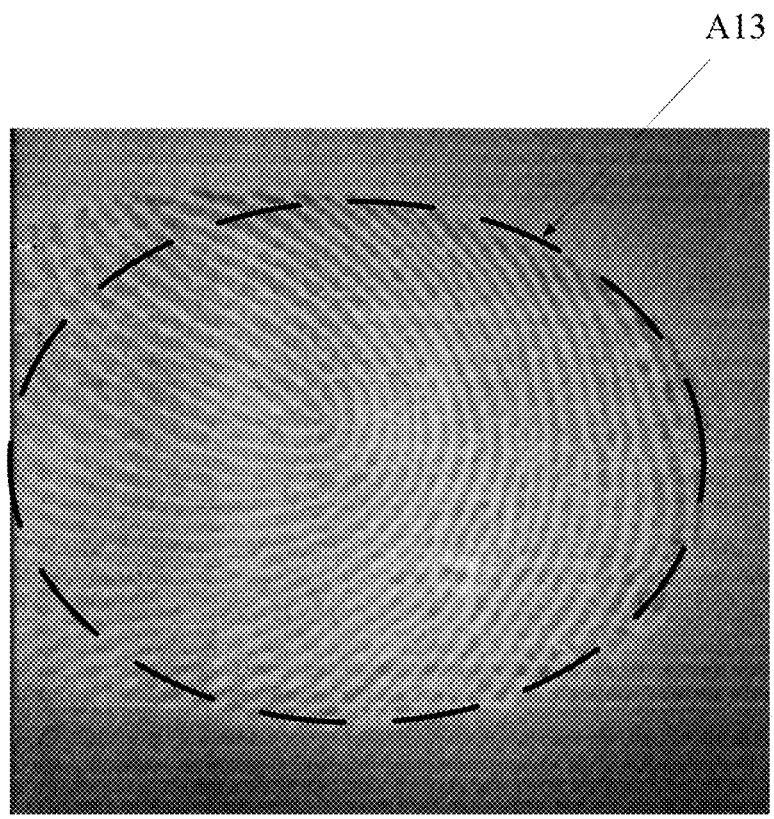
FIG. 13 illustrates a schematic imaging effect picture according to light received by a photosensitive structure of the fingerprint identification circuit, when the optical structure includes multi-layer of first optical films according to some embodiments of the present disclosure.

In the structure shown in FIG. 11, when the optical structure includes the multi-layer structure, the refractive index of the optical structure is the equivalent refractive index of all the first optical films 601, which form the optical structure. FIG. 12 and FIG. 13 illustrate schematic imaging effect pictures according to light received by the photosensitive structure of the fingerprint identification circuit, when the optical structure includes the multi-layer of the first optical films 601. The framed area A12 in FIG. 12 is a main area, where the fingerprints of the image effect picture are. The framed area A13 in FIG. 13 is a main area, where the fingerprints of the fingerprints of the image effect picture are. In FIG. 12, the multi-layer of the first optical films 601 includes three layers of the first optical films 601. The three layers of the first optical films 601 starting from close to the protective cover have the refractive indexes of 2.0, 1.4, and 2.0. In FIG. 13, the multi-layer of the first optical films 601 includes three layers of the first optical films 601. The three layers of the first optical films 601 starting from close to the protective cover have the refractive indexes of 2.0, 1.4, and 2.5. By comparing FIG. 10 to FIG. 12 and FIG. 13, in a situation that transmittances are overall close to each other, when the optical structure is composed of the multi-layer of the first optical films 601, the reflection amount of the detection light is further increased. By comparing FIG. 12 and FIG. 13, when the equivalent refractive index of the multi-layer of the first optical films 601 is greater, the optical structure increases the reflection amount of the detection light more significantly.

Figure 14:
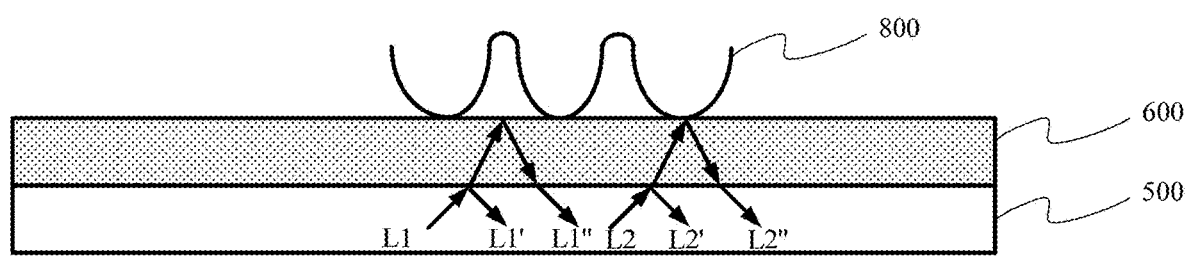
FIG. 14 illustrates a schematic structural diagram of a protective cover, an optical structure, and an operation object according to some embodiments of the present disclosure.

Based on the above-mentioned embodiments, in another embodiment of the present disclosure, FIG. 14 illustrates a schematic cross-section diagram of a protective cover, an optical structure, and an operation object according to some embodiments of the present disclosure. A refractive index of an optical structure 600 is greater than a refractive index of air and smaller than a preset refractive index. The preset refractive index is a refractive index of an operation object 800. The operation object 800 includes a fingerprint pattern. The fingerprint pattern includes fingerprint valleys and fingerprint ridges.

A thickness of the optical structure 600 is a first preset thickness. The first preset thickness is a thickness that allows an optical path of the detection light in the optical structure 600 to satisfy a first preset condition. The first preset condition is that the optical path is a positive integer multiple of a wavelength of the detection light or is a positive integer multiple of a half wavelength of the detection light.

Under an existing process condition, a precision of a thickness of the protective cover 500 is low. The existing formation process can generally ensure that a difference between the thickness of the protective cover 500 and a target thickness is within ±0.1 mm. This precision is quite different from a nanometer level precision of light and cannot satisfy a coherent condition of the light. Therefore, in the embodiments, the refractive index of the optical structure 600 is set greater than the refractive index of air, but smaller than the refractive index of the operation object 800. When the detection light is reflected at the contact surface between the optical structure 600 and the fingerprint valleys, with reference to FIG. 14, the detection light incident to a bottom surface of the optical structure 600 is L1. The detection light reflected by the bottom surface of the optical structure 600 is L1'. The detection light reflected at the contact surface between the optical structure 600 and the fingerprint valleys and exited by the optical structure 600 is L1". Since the refractive index of the optical structure 600 is greater than the refractive index of air, a half wave loss does not happen at the contact surface of the fingerprint valleys. A difference of optical paths of the light L1' and the light L1" is close to two times of the thickness of the optical structure 600.

When the detection light is reflected at a contact surface of the optical structure 600 and the fingerprint ridges, with reference to FIG. 14, the detection light incident to a bottom surface of the optical structure 600 is L2. The detection light reflected by the bottom surface of the optical structure 600 is L2'. The detection light reflected at the contact surface between the optical structure 600 and the fingerprint ridges and exited by the optical structure 600 is L2". Since the refractive index of the optical structure 600 is smaller than the refractive index of the operation object 800, a half wave loss of the light L2" happens at the contact surface of the fingerprint ridges. A phase difference of the light L2' and the light L2" is determined by the thickness of the optical structure 600. In addition, when the light L2" is reflected by the contact surface between the optical structure 600 and the operating body 800, the phase of the light L2" is also abruptly changed by π. In some embodiments, assuming that the phase of the light L2" incident to the contact surface between the optical structure 600 and the operation object 800 is θ. At the beginning when the light L2" is reflected by the contact surface, the half wave loss exists. Although the optical path of the light L2" does not change, but the phase of the light L2" is abruptly changed to θ±π. That is, the optical path difference by comparing the light L2" to the light L2' changes abruptly by a half wavelength.

For example, when the first preset condition is that the optical path is the positive integer multiple of the half wavelength of the detection light, a thickness value of the optical structure 600 satisfies $$\frac{(2n+1)\lambda}{4}.$$

Figure 15:
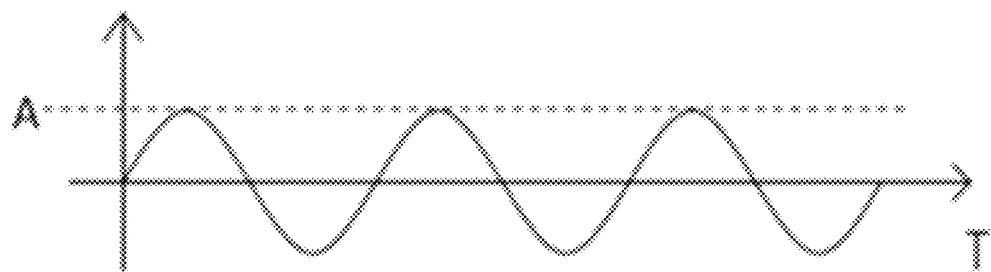
FIG. 15 illustrates a wave form of light L1' shown in FIG. 14, when the first preset condition is that an optical path is a positive integer multiple of a half wavelength of the detection light, and a value of thickness of the optical structure satisfies $$\frac{(2n+1)\lambda}{4};$$
Figure 16:
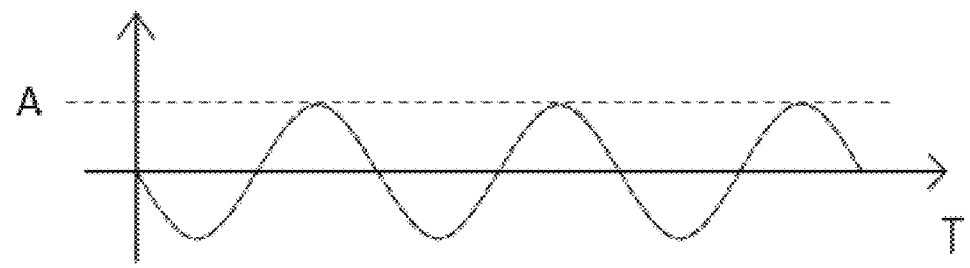
FIG. 16 illustrates a wave form of light L1" shown in FIG. 14, when the first preset condition is that an optical path is a positive integer multiple of a half wavelength of the detection light, and a value of thickness of the optical structure satisfies $$\frac{(2n+1)\lambda}{4};$$
Figure 17:
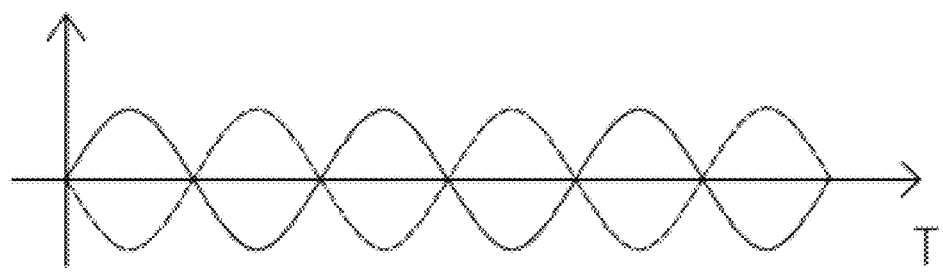
FIG. 17 illustrates a coherent ware form of light L1' and light L1" at a bottom surface of the optical structure, when the first preset condition is that an optical path is a positive integer multiple of a half wavelength of the detection light, and a value of thickness of the optical structure satisfies $$\frac{(2n+1)\lambda}{4};$$

As mentioned above, no half-wave loss happens during propagation of the light L1, that is, the optical path difference between the light L1' and the light L1" is $$2 \times \frac{(2n+1)\lambda}{4},$$

and the phase difference between the light L1' and the light L1" is rπ. FIG. 15 illustrates a waveform of the light L1', FIG. 16 illustrates a waveform of the light L1", and FIG. 17 illustrates an interference waveform of the light L1' and the light L1" at the bottom surface of the optical structure 600. In FIG. 15 to FIG. 17, the coherent light L1' and the light L1" are always in a destructive state at the bottom surface of the optical structure 600. The abscissa is time T, the ordinate is amplitude, and A represents the amplitude of the light L1' and the light L1".

Figure 18:
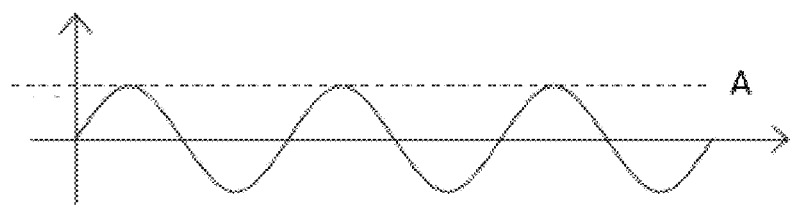
FIG. 18. illustrates a wave form of light L2' shown in FIG. 14, when the first preset condition is that an optical path is a positive integer multiple of a wavelength of the detection light, and a value of thickness of the optical structure satisfies $$\frac{n\lambda}{2};$$
Figure 19:
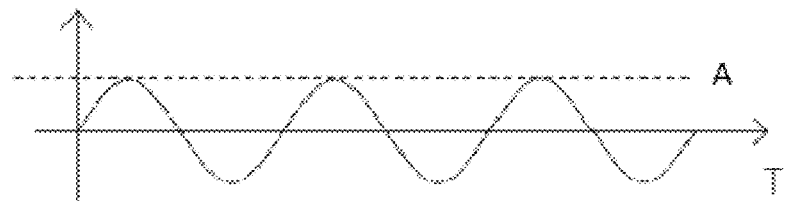
FIG. 19 illustrates a wave form of light L2" shown in FIG. 14, when the first preset condition is that an optical path is a positive integer multiple of a wavelength of the detection light, and a value of thickness of the optical structure satisfies $$\frac{n\lambda}{2};$$
Figure 20:
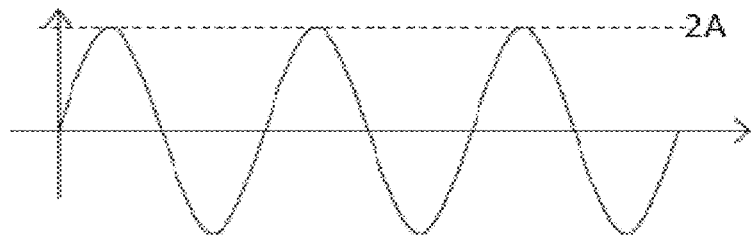
FIG. 20 illustrates a coherent ware form of light L2' and light L2" at a bottom surface of the optical structure shown in FIG. 14, when the first preset condition is that an optical path is a positive integer multiple of a wavelength of the detection light, and a value of thickness of the optical structure satisfies $$\frac{n\lambda}{2};$$

The light L2 has a half wave loss during light propagation. Therefore, the phase difference of the light L2' and the light L2" is determined by the thickness of the optical structure 600, in addition, the phase changes abruptly by π. Since the difference of the optical paths of the light L2' and the light L2" is $$2 \times \frac{(2n+1)\lambda}{4},$$

and a half wave loss exists, the phase difference of the light L2' and the light L2" is 2nπ. FIG. 18 illustrates a waveform of the light L2', FIG. 19 illustrates a waveform of the light L2", and FIG. 20 illustrates an inference waveform of the light L2' and the light L2" at the bottom surface of the optical structure 600. In FIG. 18 to FIG. 20, the coherent the light L2' and the light L2" are always in a coherently enhanced state at the bottom surface of the optical structure 600. The abscissa is time T, the ordinate is amplitude, and A represents the amplitude of the light L2' and the light L2".

That is, when the first preset condition is that the optical path is a positive integer multiple of a half wavelength of the detection light, the reflected light of the detection light at the fingerprint ridges is in the coherently enhanced state, and the reflected light of the detection light at the fingerprint valleys is in a coherently canceled state. Therefore, the signal intensity contrast between the fingerprint valleys and the fingerprint ridges can be improved, such that the fingerprint identification accuracy is improved for the fingerprint identification circuit.

When the first preset condition is that the optical path is a positive integer multiple of the wavelength of the detection light, the value of the thickness of the optical structure 600 satisfies $$\frac{n\lambda}{2}.$$

Similar to the above description, the phase difference of the light L1' and the light L1" is 2nπ, and the phase difference between the light L2' and the light L2" is nπ. Therefore, the detection light coherently cancels at the fingerprint ridges, and coherently enhances at the fingerprint valleys. The signal intensity contrast of the fingerprint valleys and the fingerprint ridges can be improved, such that the fingerprint identification accuracy is improved for the fingerprint identification circuit.

In some embodiments, when the operation object 800 is a finger, a value range of a preset refractive index is from about 1.39 to about 1.46.

Based on the above-mentioned embodiments, in an alternative embodiment of the present disclosure, to prevent the optical structure 600 from forming interference enhancement to external light of the display panel, when the refractive index of the optical structure 600 is greater than the refractive index of the protective cover 500, the first preset thickness is $$\frac{n}{2}\lambda,$$

n is a positive integer greater than 0, and λ represents a preset wavelength. When the detection light is monochromatic light, the preset wavelength is the wavelength of the detection light. When the detection light is polychromatic light, a value range of the preset wavelength is a wavelength range of the detection light.

When the refractive index of the optical structure 600 is smaller than the refractive index of the protective cover 500, the first preset thickness is $$\frac{(2n+1)}{4}\lambda,$$

n is a positive integer greater than 0, and λ represents the preset wavelength. When the detection light is monochromatic light, the preset wavelength is the wavelength of the detection light. When the detection light is polychromatic light, the value range of the preset wavelength is a wavelength range of the detection light.

For example, when the detection light is red light, the value range of the preset wavelength may be from about 640 nm to about 780 nm. When the detection light is blue, the value range of the preset wavelength may be from about 407 nm to about 505 nm.

Figure 21:
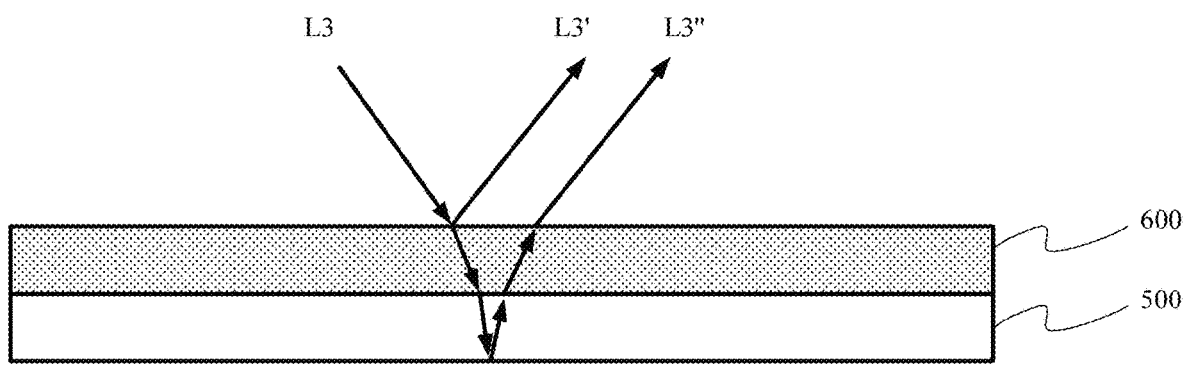
FIG. 21 illustrates a schematic diagram when external light is incident to the optical structure according to some embodiments of the present disclosure.

In the embodiments, FIG. 21 illustrates a schematic diagram of external light incident to the optical structure 600 according to some embodiments of the present disclosure. L3 is the external light. L3' represents the external light reflected by the top surface of the optical structure 600. L3" represents the external light reflected by the bottom surface of the optical structure 600.

When the refractive index of the optical structure 600 is greater than the refractive index of the protective cover 500, and the first thickness is $$\frac{n}{2}\lambda,$$

the light L3 has a half wave loss at a contact surface between the protective cover 500 and the optical structure 600 during light propagation, and the phase difference between the light L3' and the light L3" at the top surface of the optical structure 600 is rm. Therefore, the light L3' and the light L3" coherently cancel at the top surface of the optical structure, and no coherent fringe is formed. While the fingerprint identification accuracy of the fingerprint identification circuit is improved, the normal display of the display panel is not affected.

Similarly, when the refractive index of the optical structure 600 is smaller than the refractive index of the protective cover 500, and the first preset thickness is $$\frac{(2n+1)}{4}\lambda,$$

the light L3 does not have a half wave loss at the contact surface between the protective cover 500 and the optical structure 600 during the light propagation. The phase difference between the light L3' and the light L3" at the top surface of the optical structure 600 is rm. The light L3' and the light L3" coherent cancel at the top surface of the optical structure 600. No coherent fringe is formed. The normal display of the display panel is not affected.

In an alternative embodiment of the present disclosure, when the detection light is polychromatic light, the preset wavelength value range is from about 500 nm to about 650 nm.

Figure 22:
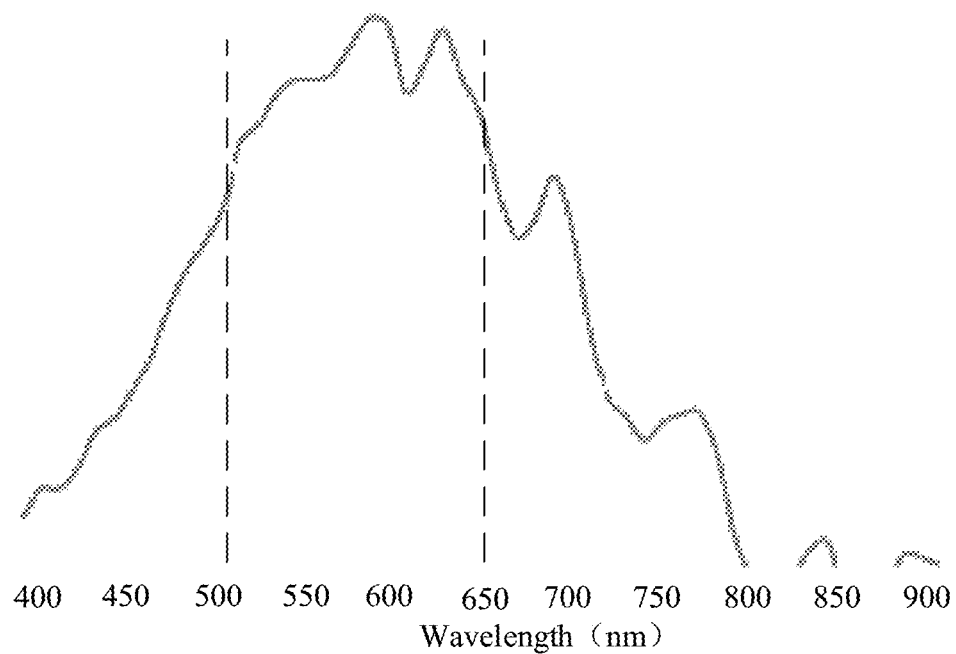
FIG. 22 illustrates a schematic diagram of the sensitivity curve of an existing fingerprint identification circuit to light.

Considering that the sensitive wave band of the fingerprint identification circuit to the detection light is from about 500 nm to about 650 nm in general, FIG. 22 illustrates a schematic diagram of the sensitivity curve of an existing fingerprint identification circuit to light. FIG. 22 is obtained through experiment and simulation methods after performing research for different sensitivities of the fingerprint identification circuit on light with different wavelengths. The abscissa in FIG. 22 represents the different wavelengths of the detection light, and the ordinate is the normalized value and is used to represent the sensitivity of the fingerprint identification circuit to the light with the different wavelengths. That is, in FIG. 22, the higher the value of the ordinate is, the greater the sensitivity of the fingerprint identification circuit to the wavelength is.

With reference to FIG. 22, when the wavelength of the detection light is greater than or equal to 500 nm, the fingerprint identification circuit has a higher sensitivity to the detection light. When the wavelength of the detection light is greater than 650 nm, the sensitivity of the fingerprint identification circuit to the detection light starts to decrease significantly. Therefore, the value range of the preset wavelength is set to from about 500 nm to about 650 nm, which is beneficial to improve the fingerprint identification accuracy and sensitivity of the fingerprint identification circuit.

Figure 23:
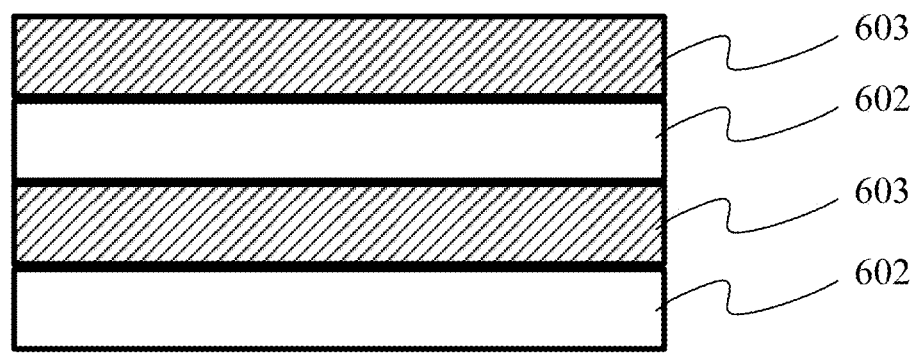
FIG. 23 illustrates a schematic cross-section diagram of an exemplary optical structure according to some embodiments of the present disclosure.

Similarly, when the refractive index of the optical structure is greater than the refractive index of air and smaller than the preset refractive index, the optical structure may still be composed of a multi-layer of films. FIG. 23 illustrates a schematic cross-section diagram of an exemplary optical structure according to some embodiments of the present disclosure. The optical structure includes multiple layers of second optical films 602 and multiple layers of third optical films 603. The second optical films 602 and the third optical films 603 are alternately stacked one over another. The second optical films 602 and the third optical films 603 have different refractive indexes. An equivalent refractive index of the multi-layer of the second optical films 602 and the multi-layer of the third optical films 603 is greater than the refractive index of air but smaller than the preset refractive index.

The second optical films 602 may have multiple refractive index values. The third optical films 603 may also have multiple refractive index values. As long as the equivalent refractive index of the optical structure composed of the multi-layer of the second optical films 602 and the multi-layer of the third optical films 603 satisfy the condition of being greater than the refractive index of air and smaller than the preset refractive index.

Similar to an above-mentioned simulation result, when the optical structure is composed of the multi-layer of the films, stacked one over another, it is beneficial to further improve the effect that the optical structure increases the reflection amount of the detection light is improved. In some embodiments, when the refractive index of the optical structure is greater than the refractive index of air and smaller than the preset refractive index, and the optical structure is composed of the multi-layer of the films, a display effect of the display panel is beneficial to be optimized.

Similarly, to prevent the optical structure from forming the coherent enhancement to the external light of the display panel, when the equivalent refractive index of the multi-layer of the second films 602 and the multi-layer of the third films 603 is smaller than the refractive index of the protective cover, the first preset thickness is $$\frac{(2n+1)}{4}\lambda,$$

n is the positive integer bigger than 0, and λ represents the preset wavelength. When the detection light is monochromatic light, the preset wavelength is the wavelength of the detection light. When the detection light is polychromatic light, the value range of the preset wavelength is the wavelength range of the detection light.

When the equivalent refractive index of the multi-layer of the second films 602 and the multi-layer of the third films 603 is greater than the refractive index of the protective cover, the first preset thickness is $$\frac{n}{2}\lambda,$$

n is the positive integer bigger than 0, and λ represents the preset wavelength. When the detection light is monochromatic light, the preset wavelength is the wavelength of the detection light. When the detection light is polychromatic light, the value range of the preset wavelength is the wavelength range of the detection light.

With further reference to FIG. 21, L3 is the external light. L3' represents the external light reflected by the top surface of the optical structure. L3" represents the external light reflected by the bottom surface of the optical structure.

When the equivalent refractive index of the multi-layer of the second films 602 and the multi-layer of the third films 603 is smaller than the refractive index of the protective cover, the first preset thickness is $$\frac{(2n+1)}{4}\lambda,$$

and the light L3 does not have a half wave loss at the contact surface between the protective cover and the optical structure during light propagation. The phase difference of the light L3' and the light L3" at the top surface of the optical structure is rm. The light L3' and the light L3" coherently cancel at the top surface of the optical structure. No coherent fringe is formed. The normal display of the display panel is not affected.

When the equivalent refractive index of the multi-layer of the second films 602 and the multi-layer of the third films 603 is smaller than the refractive index of the protective cover, the first preset thickness is $$\frac{n}{2}\lambda,$$

and the light L3 has a half wave loss at the contact surface between the protective cover and the optical structure during light propagation. The phase difference of the light L3' and the light L3" at the top surface of the optical structure is rm. The light L3' and the light L3" coherently cancel at the top surface of the optical structure. No coherent fringe is formed. The normal display of the display panel is not affected.

Figure 24:
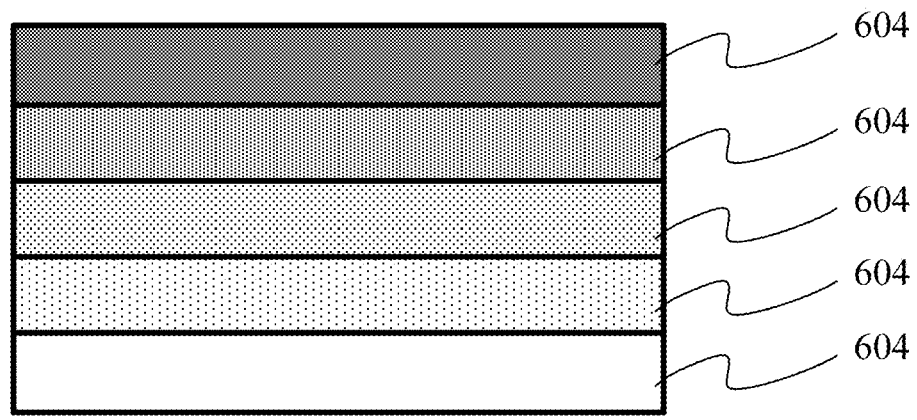
FIG. 24 illustrates a schematic cross-section diagram of an exemplary optical structure according to some embodiments of the present disclosure.

Based on the above-mentioned embodiments, in another embodiment of the present disclosure, FIG. 24 illustrates a schematic cross-section diagram of an exemplary optical structure according to some embodiments of the present disclosure. In the embodiments, detection light includes multiple types of detection sub-light with different wavelengths. To realize a purpose that each detection sub-light forms coherent enhancement or coherent cancel at fingerprint valleys or fingerprint ridges, the optical structure is configured with a multi-layer of fourth optical films 604, stacked one over another. The plurality of detection sub-light is numbered sequentially from 1.

The optical structure includes the multi-layer of the fourth films 604, sequentially stacked starting from the protective cover. The multiple layers of the fourth optical films are numbered sequentially from 1.

The refractive index of each of the multiple layers of the fourth films 604 is greater than the refractive index of air and smaller than the preset refractive index. The preset refractive index is the refractive index of the operation object. The operation object includes fingerprints, and the fingerprints include fingerprint valleys and fingerprint ridges.

The refractive indexes of the multiple layers of the fourth optical films 604 decrease or increase sequentially from the surface of the protective cover.

A thickness of a i-numbered fourth optical film 604 is a second preset thickness. The second preset thickness is a thickness that an optical path of i-numbered detection light in the optical structure satisfies a second preset condition. The second preset condition is that the optical path is a positive integer multiple of a wavelength of the i-numbered detection sub-light or a positive integer multiple of a half wavelength of the i-numbered detection sub-light, where i=1, 2, . . . .

For example, assuming that the detection sub-light includes three detection light with different wavelengths. The three detection sub-light is numbered with 1, 2, and 3. Assuming that the wavelength of the 1-numbered detection sub-light is $\lambda_1$, the wavelength of the 2-numbered detection sub-light is $\lambda_2$, and the wavelength of the 3-numbered detection sub-light is $\lambda_3$. Correspondingly, the optical structure includes three layers of the fourth optical films 604. The three layers of the fourth optical films 604 are numbered with 1, 2, and 3, which correspond to the detection sub-light, respectively. The thickness of the 1-numbered fourth optical film 604 is the second preset thickness. The second preset thickness is the thickness that the optical path of the 1-numbered detection sub-light at the optical structure satisfies the second preset condition. The second preset condition is that the optical path is a positive integer multiple of the wavelength of the 1-numbered detection sub-light or a positive integer multiple of the half wavelength of the 1-numbered detection sub-light. Similarly, the thickness of the 2-numbered fourth optical film 604 is the second preset thickness. The second preset thickness is the thickness that the optical path of the 2-numbered detection sub-light at the optical structure satisfies the second preset condition. The second preset condition is that the optical path is a positive integer multiple of the wavelength of the 2-numbered detection sub-light or a positive integer multiple of the half wavelength of the 2-numbered detection sub-light, and so on for the 3-numbered detection sub-light.

In some embodiments, the equivalent refractive index of the optical structure is greater than the refractive index of the protective cover. To prevent the optical structure from forming the coherent enhancement to the external light of the display panel, the second preset thickness is $$\frac{n}{2}\lambda,$$

n is the positive integer greater than 0, and λ represents the wavelength of the i-numbered detection sub-light.

When the equivalent refractive index of the optical structure is smaller than the refractive index of the protective cover, the second preset thickness is $$\frac{(2n+1)}{4}\lambda,$$

n is the positive integer greater than 0, and λ represents the wavelength of the i-numbered detection sub-light.

With further reference to FIG. 21, L3 is the external light, L3' represents the external light reflected by the top surface of the optical structure, and L3" represents the light reflected by the bottom surface of the optical structure. When the equivalent refractive index of the optical structure is greater than the refractive index of the protective cover, and the second preset thickness is $$\frac{n}{2}\lambda,$$

the light L3 has the half wave loss at the contact surface between the protective cover and the optical structure during the light propagation. The phase difference between the light L3' and the light L3" is rm. Therefore, the light L3' and the light L3" coherently cancel at the top surface of the optical structure. No coherent fringe is formed. The normal display of the display panel is not affected.

When the equivalent refractive index of the optical structure is smaller than the refractive index of the protective cover, and the second preset thickness is $$\frac{n}{2}\lambda,$$

the light L3 does not have the half wave loss at the contact surface between the protective cover and the optical structure during the light propagation. The phase difference between the light L3' and the light L3" is rm. Therefore, the light L3' and the light L3" coherently cancel at the top surface of the optical structure. No coherent fringe is formed. The normal display of the display panel is not affected.

Figure 25:
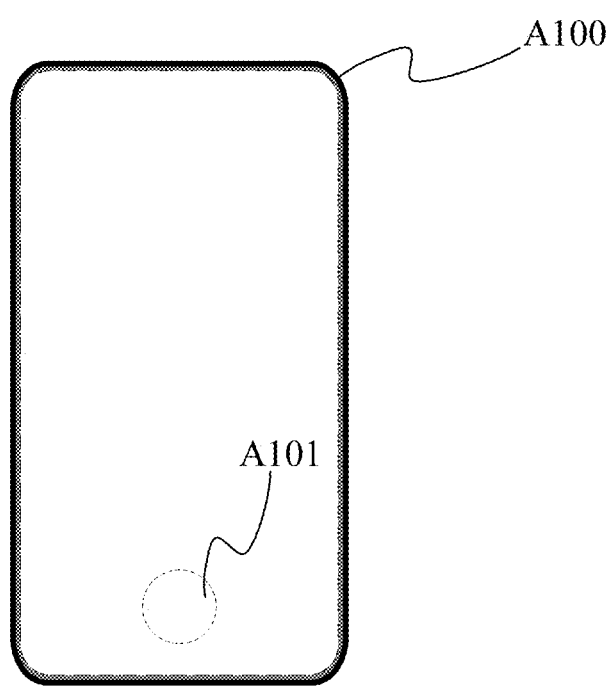
FIG. 25 illustrates a schematic diagram of appearance of an exemplary display device according to some embodiments of the present disclosure.

Correspondingly, embodiments of the present disclosure also provide a display device. FIG. 25 illustrates a schematic diagram of appearance of the display device A100. The display device A100 includes a display panel of any above-mentioned embodiments. In FIG. 25, a dashed frame A101 represents a fingerprint identification area of the display device.

The embodiments in the present specification are described in a progressive manner. Each embodiment focuses differently from other embodiments. For the same and similar parts among the embodiments, reference is made to each other.

The above description of the disclosed embodiments enables those skilled in the art to implement or use the present disclosure. Various modifications to these embodiments are apparent to those skilled in the art. The general principles defined herein may be implemented in other embodiments without departing from the spirit or scope of the present disclosure. Therefore, the present disclosure is not limited to the embodiments shown in this specification but should conform to the widest scope consistent with the principles and novel features disclosed in the specification.

What is claimed is:

1. A display panel, comprising:
   an array substrate and a protective cover, disposed oppositely, wherein the protective cover is located at a light exiting side of the array substrate;
   a fingerprint identification circuit, located at a side of the array substrate facing away or toward the protective cover, wherein the fingerprint identification circuit is configured to receive detection light and perform a fingerprint detection according to the detection light; and
   an optical structure, located at a side of the protective cover facing away from the array substrate, wherein the optical structure is configured to increase a reflection amount of the detection light received by the fingerprint identification circuit, and a refractive index of the optical structure is greater than a refractive index of air and smaller than a refractive index of an operation object, wherein:
   the operation object includes fingerprint patterns, the fingerprint patterns including fingerprint valleys and fingerprint ridges; and
   a thickness of the optical structure is a first preset thickness, such that an optical path of the detection light in the optical structure is a positive integer multiple of a wavelength of the detection light or a positive integer multiple of a half wavelength of the detection light.

2. The display panel according to claim 1, wherein a refractive index of the optical structure is greater than a refractive index of the protective cover.

3. The display panel according to claim 2, wherein the optical structure has a single layer structure or a multi-layer structure.

4. The display panel according to claim 1, wherein a value range of the refractive index is from about 1.36 to about 1.46.

5. The display panel according to claim 1, wherein:
   when the refractive index of the optical structure is greater than a refractive index of the protective cover, the first preset thickness is $$\frac{n}{2}\lambda,$$

n is a positive integer greater than 0, and λ, represents a preset wavelength;

when the detection light is monochromatic light, the preset wavelength is the wavelength of the detection light; and when the detection light is polychromatic light, a value range of the preset wavelength is a wavelength range of the detection light.

6. The display panel according to claim 1, wherein:

when the refractive index of the optical structure is smaller than a refractive index of the protective cover, the first preset thickness is $$\frac{(2n+1)}{4}\lambda,$$

n is a positive integer greater than 0, and λ, represents a preset wavelength;

when the detection light is monochromatic light, the preset wavelength is the wavelength of the detection light; and when the detection light is polychromatic light, a value range of the preset wavelength is a wavelength range of the detection light.

7. The display panel according to claim 6, wherein a value range of the preset wavelength is from about 500 nm to about 650 nm.

8. The display panel according to claim 1, wherein:

the optical structure includes a multi-layer of second optical films and a multi-layer of third optical films;

the second optical films and the third optical films are alternately stacked one over another;

refractive indexes of a second optical film and a third optical film are different; and an equivalent refractive index of the multi-layer of the second optical films and the multi-layer of the third optical films is greater than a refractive index of air and smaller than the refractive index of an operation object.

9. The display panel according to claim 8, wherein:

when the equivalent refractive index of the multi-layer of the second optical films and the multi-layer of the third optical films is smaller than a refractive index of the protective cover, the first preset thickness is $$\frac{(2n+1)}{4}\lambda,$$

n is a positive integer greater than 0, and λ represents a preset wavelength;

when the detection light is monochromatic light, the preset wavelength is the wavelength of the detection light; and when the detection light is polychromatic light, a value range of the preset wavelength is a wavelength range of the detection light.

10. The display panel according to claim 8, wherein:

when the equivalent refractive index of the multi-layer of the second optical films and the multi-layer of the third optical films is greater than a refractive index of the protective cover, the first preset thickness is $$\frac{n}{2}\lambda,$$

n is a positive integer greater than 0, and λ, represents a preset wavelength;

when the detection light is monochromatic light, the preset wavelength is the wavelength of the detection light; and when the detection light is polychromatic light, a value range of the preset wavelength is a wavelength range of the detection light.

11. The display panel according to claim 1, wherein:

the optical structure includes a multi-layer of fourth optical films sequentially stacked starting from a surface of the protective cover;

the fourth optical films are numbered sequentially starting from 1;

a refractive index of each of the fourth optical films is greater than a refractive index of air and smaller than a preset refractive index;

the preset refractive index is the refractive index of an operation object;

and refractive indexes of the fourth optical films in the multi-layer are decreased or increased sequentially from the surface of the protective cover.

12. The display panel according to claim 11, wherein:

the detection light includes multiple types of detection sub-light with different wavelengths;

the multiple types of the detection sub-light are numbered sequentially starting from 1;

a thickness of a i-numbered fourth optical film is a second preset thickness, such that an optical path of the i-numbered detection sub-light in the optical structure is a positive integer multiple of a wavelength of the i-numbered detection sub-light or a positive integer multiple of a half wavelength of the i-numbered detection sub-light.

13. The display panel according to claim 12, wherein when an equivalent refractive index of the optical structure is greater than a refractive index of the protective cover, the second preset thickness is $$\frac{n}{2}\lambda,$$

n is a positive integer greater than 0, and λ, represents the wavelength of the i-numbered detection sub-light.

14. The display panel according to claim 12, wherein when an equivalent refractive index of the optical structure is smaller than a refractive index of the protective cover, the second preset thickness is $$\frac{(2n+1)}{4}\lambda,$$

n is a positive integer greater than 0, and λ, represents the wavelength of the i-numbered detection sub-light.

15. The display panel according to claim 1, wherein the detection light is invisible light.

16. The display panel according to claim 15, wherein the invisible light is infrared light or microwave.

17. The display panel according to claim 1, further comprising a color film substrate located at a side of the array substrate facing toward the protective cover, wherein:

the array substrate further includes gate lines and data lines, arranged across each other to define areas for configuring display pixels.

18. A display panel, comprising:

an array substrate and a protective cover, disposed oppositely, wherein the protective cover is located at a light exiting side of the array substrate;

a fingerprint identification circuit, located at a side of the array substrate facing away or toward the protective cover, wherein the fingerprint identification circuit is configured to receive detection light and perform a fingerprint detection according to the detection light; and an optical structure, located at a side of the protective cover facing away from the array substrate, wherein the optical structure is configured to increase a reflection amount of the detection light received by the fingerprint identification circuit, wherein:

a refractive index of the optical structure is greater than a refractive index of the protective cover;

the optical structure has a single layer structure or a multi-layer structure; and when the optical structure is the multi-layer structure:
  the optical structure includes a multi-layer of first optical films, sequentially stacked one over another, and adjacent first optical films have different refractive indexes; and
  an equivalent refractive index of the multi-layer of the first optical films is greater than the refractive index of the protective cover.

19. A display device, comprising:

a display panel, comprising:

an array substrate and a protective cover, disposed oppositely, wherein the protective cover is located at a light exiting side of the array substrate;

a fingerprint identification circuit, located at a side of the array substrate facing away or toward the protective cover, wherein the fingerprint identification circuit is configured to receive detection light and perform a fingerprint detection according to the detection light; and an optical structure, located at a side of the protective cover facing away from the array substrate, wherein the optical structure is configured to increase a reflection amount of the detection light received by the fingerprint identification circuit, and a refractive index of the optical structure is greater than a refractive index of air and smaller than a refractive index of an operation object, wherein:

the operation object includes fingerprint patterns, the fingerprint patterns including fingerprint valleys and fingerprint ridges; and a thickness of the optical structure is a first preset thickness, such that an optical path of the detection light in the optical structure is a positive integer multiple of a wavelength of the detection light or a positive integer multiple of a half wavelength of the detection light.

* * * * *